(12) United States Patent
Bill et al.

(10) Patent No.: US 7,499,309 B1
(45) Date of Patent: Mar. 3, 2009

(54) USING ORGANIC SEMICONDUCTOR MEMORY IN CONJUNCTION WITH A MEMS ACTUATOR FOR AN ULTRA HIGH DENSITY MEMORY

(75) Inventors: Colin Bill, Cupertino, CA (US); Michael A. VanBuskirk, Saratoga, CA (US); Tzu-Ning Fang, Palo Alto, CA (US)

(73) Assignee: Spansion LLC, Sunnyvale, CA (US)

( * ) Notice: Subject to any disclaimer, the term of this patent is extended or adjusted under 35 U.S.C. 154(b) by 909 days.

(21) Appl. No.: 10/817,186

(22) Filed: Apr. 2, 2004

(51) Int. Cl.
*G11C 11/00* (2006.01)
(52) U.S. Cl. .................... 365/151; 257/40; 365/153; 369/126
(58) Field of Classification Search .............. 257/40; 365/151, 153, 164, 166; 369/126
See application file for complete search history.

(56) References Cited

U.S. PATENT DOCUMENTS

| 4,889,988 | A | * | 12/1989 | Elings et al. ............... 250/306 |
| 5,289,408 | A | * | 2/1994 | Mimura et al. .............. 369/126 |
| 6,542,400 | B2 | * | 4/2003 | Chen et al. .................. 365/151 |
| 6,656,763 | B1 | * | 12/2003 | Oglesby et al. ............... 438/99 |
| 6,806,526 | B2 | * | 10/2004 | Krieger et al. ............... 257/296 |
| 7,233,517 | B2 | * | 6/2007 | Rust ........................... 365/151 |
| 2005/0052983 | A1 | * | 3/2005 | Vincent et al. .............. 369/126 |

OTHER PUBLICATIONS

Shao et al. "Mechanical Properties and Fretting Behavior of Sulfide Film," Oct. 1998, Proceedings of the Forty-fourth IEEE Holm Conference on Electrical Contacts. pp. 34-43.*

* cited by examiner

*Primary Examiner*—Van Thu Nguyen
*Assistant Examiner*—Alexander Sofocleous
(74) *Attorney, Agent, or Firm*—Amin, Turocy & Calvin, LLP

(57) ABSTRACT

A metal sulfide based non-volatile memory device is provided herein. The device is comprised of a substrate, a backplane, a planar memory media including a dense array of metal sulfide based memory cells, and a MEMS probe based actuator. The cells of the memory device are operative to be of two or more states corresponding to various levels of impedance. The MEMS actuator is operable to position micro/nano probes over the appropriate cells to enable reading, writing, and erasing the memory cells by applying a bias voltage.

19 Claims, 7 Drawing Sheets

USING ORGANIC SEMICONDUCTOR MEMORY IN CONJUNCTION WITH A MEMS ACTUATOR FOR AN ULTRA HIGH DENSITY MEMORY

TECHNICAL FIELD

The present invention relates generally to data storage devices, and more particularly to a system and method for providing ultra high-density memory using a MEMS actuator in combination with a metal sulfide based semiconductor memory media.

BACKGROUND

Computer information technology continues to spread expeditiously throughout our contemporary society. Moreover, the proliferation of such technology fuels a persistent demand for smaller and higher density storage devices. At present, computer technologies pervade many aspects of modern life in the form of portable devices such as PDA's, phones, pagers, digital cameras, MP3 players, and laptop computers to name but a few. Furthermore, the public's fervent desire for omnipresent computing technologies ensures that the movement toward developing small, fast, low power, inexpensive, and high-density memory will continue into the distant future. However, to meet such demand and make effective use of exponentially increasing processing power requires that novel data storage technologies be developed.

Memory technologies such as dynamic random access memory (DRAM) and synchronous random access memory (SRAM) are problematic at least because of the fact that they are volatile memory devices. While, volatile memory is important to computing devices, it is fundamentally more important to portable devices that information be capable of being stored without fear of loss due to a power failure (e.g. dead battery). Nevertheless, conventional nonvolatile mass storage devices are encountering inherent physical limitations that will restrict their growth and thus their usefulness in the future.

Magnetic storage devices are restricted in that their densities are constrained by superparamagnetism. Superparamagnetism is a phenomenon exhibited when the magnetic orientation energy, which holds the value of bits, equals the surrounding thermal energy of the disk device itself. In such a case, memory cells are caused to spontaneously flip at normal operating temperatures and previously stored data is jumbled. Therefore, magnetic storage technologies are limited in the amount of bits of information per square inch that they can store before thermodynamic effects compromise the data. Furthermore, the large size of conventional magnetic storage devices, such as computer hard drives, prohibits their successful use in small portable devices such as PDA's, mobile phones, and digital cameras.

Optical memory is also physically limited, not by superparamagnetism, but by the diffraction limit. Data is stored on an optical media in the form of pits of varying length formed by a laser beam. The size each recorded optical bit or spot size is limited by the wavelength of the light used to record each bit of information. In general, a smaller wavelength means a smaller spot size and a higher recording density. For example, typical compact disk (CD) uses a laser at a wavelength of 780 nm, which results in a spot size of about 1 micron, whereas, a digital versatile disk (DVD) operates at a wavelength of 650 nm resulting in a spot size of about 0.5 microns. Moreover, even though optical devices are capable of performing the same tasks as magnetic memory devices, they have inferior data rate and access times in addition to having a higher cost per megabyte.

Flash memory is a newer technology. Flash memory is solid-state storage technology, which provides such benefits as fast access times and small size. However, this technology is cost prohibitive with respect to mass storage. Specifically, the cost per megabyte of flash memory is extremely expensive when compared to other devices. For example, an 80-gigabyte hard drive currently costs under $200 (less than a quarter of a cent per MB), whereas 512-MB compact flash card costs around $230 (about 45 cents per MB). Accordingly, 80 gigabytes of flash memory would cost over $34,000. Thus, there is need for a new technology that is capable of storing a large amount of data, in a very small space, at a relatively low cost.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention comprises microelectromechanical systems (MEMS) actuated probe based memory technology in conjunction with a metal sulfide based semiconductor film memory media. Areal density or the number of bits per square inch, in a probe-based system is a function of probe size, probe resolution, and precision of actuation. The present invention provides tremendous improvements over conventional storage devices by optimizing each of these parameters, resulting in a high capacity, inexpensive, and extremely small non-volatile memory device.

The metal sulfide based memory media of the present invention is a planar memory medium. The medium is identical in all directions. A memory 'cell' is defined by the positioning of a probe above the medium. Each unique probe position defines a 'cell' location. The memory media film may include a metal sulfide based material such as a polymer, for instance, and other materials such as an active layer that controls the conductivity of the polymer. The active layer is a metal sulfide such as silver or copper sulfide. The memory cell can then be programmed, written, or erased by simply applying a bias voltage across the cell media location, which causes the memory cell to take on a desired impedance state.

A metal sulfide based memory cell that is programmed by means of impedance levels is advantageous in several ways. First, in contrast to conventional memory cells that can only hold two bits of information (e.g., high or low), each metal sulfide based memory cell is capable of holding a plurality of bits, because the conductive media of the memory cell can have numerous impedance intensities (e.g., high, low, medium, very low, etc.). Therefore, the areal density of an array of memory cells is drastically increased at no additional cost. A further advantage of metal sulfide based memory cells is that they have low power requirements, largely because they do not require a constant power supply or refresh cycles to maintain the desired state like some conventional random access memories (RAM). Additionally, the present invention provides metal sulfide based memory devices that possess at least one or more of the following: small size compared to inorganic memory devices, low cost, high reliability, long life, light weight, and extended memory retention. Employing MEMS technology in conjunction with a metal sulfide based media provides still further advantages over conventional memory devices.

MEMS technology enables integration of electrical and mechanical components at a sub-micron scale, which facilitates forming a memory device that is both extremely small and relatively inexpensive. The memory device of the present invention uses micro-fabricated components to reduce the scale and power consumption of the memory device. Power consumption is further reduced due in part to the use of rectilinear motion as opposed to more power hungry rotating medias (e.g., magnetic or optical disk). Additionally, because MEMS fabrication employs traditional semiconductor processing technologies, the cost of manufacturing MEMS based memory devices is mitigated.

One embodiment of the present invention employs an array of MEMS probes to read, write, and erase metal sulfide based memory cells. Simple surface contacting probes or the more complex scanning tunneling probes may be used to provide nano-scale surface observation and memory cell programming. Scanning tunneling probes operate using quantum mechanical tunneling. Quantum mechanical tunneling, or tunnel current, can be induced by applying a bias voltage between the probe and the memory cell. The probe tips, being positioned very close to the media surface, are capable of detecting tunnel current between the probe and the memory cell, thereby allowing the tunnel current to be measured and the impedance state of the memory cell to be determined. The foremost advantage to using probes is their size. Traversing a memory device with nanometer size probe tips that can sense forces at an atomic level allows the bits sizes of the media to be extremely small. However, bit size is also limited by the resolution of probe actuation.

A high precision mechanism is required in order to access multiple memory cells via probe actuation. MEMS actuators provide such positioning. Using different actuating technologies a MEMS actuator may deliver micro actuations of sub-micron to nano-level resolution. Besides the diminutive size, the MEMS actuation of the present invention is extremely accurate. One reason for such accuracy is that the probes may but are not required to maintain continuous contact with the surface. In contrast, conventional memory devices that employ probes in constant contact with a media have problems with static friction ("striction"), which prevents accurate positioning and thereby limits discernible cell size. A further advantage of the metal sulfide based memory medium in conjunction with a MEMS actuator is that the selection of the memory cell location does not involve a selection device, such as a diode or transistor, integrated with the cell. Selection is through location by the MEMS probes.

The present invention provides a considerable improvement over conventional mass storage technologies by vastly increasing data density. Employing atomic scale probes alone can significantly increases areal density by making distinguishable memory cell sizes many times smaller than conventional technologies (e.g., flash memory). When this increase in density is then combined with a multiple cell state metal sulfide based media, the result is an extremely small, inexpensive, and low power ultra-high density memory device.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION

The present invention is now described with reference to the annexed drawings, wherein like numerals refer to like elements throughout. It should be understood, however, that the drawings and detailed description thereto are not intended to limit the invention to the particular form disclosed. Rather, the intention is to cover all modifications, equivalents, and alternatives falling within the spirit and scope of the present invention.

The present invention provides a metal sulfide based memory media functioning as a non-volatile memory device. The cells of the memory device are operative to be of two or more states corresponding to various levels of impedance. Applying a bias voltage sets or programs these states, and the cells maintain their states until another voltage, a reverse bias, is applied. This characteristic permits nonvolatile operation, and as a result there is no need to refresh or supply continuous power to sustain cell states. To read or retrieve a state value, the cell impedance may be measured electrically via a tunneling current, for example. Alternatively, cells can be written or programmed by applying a bias voltage to each memory cell via an array of micro/nano probes mounted on a micro-electromechanical systems (MEMS) actuator. Moreover, because the probe tips can be constructed nano-sharp and precisely positioned, memory cells may be constructed and addressed at a molecular or even atomic scale. Therefore, the present invention provides ultra-high areal density while also increasing device performance and lowering the cost per megabyte of storage relative to conventional nonvolatile memory devices.

Figure 1:
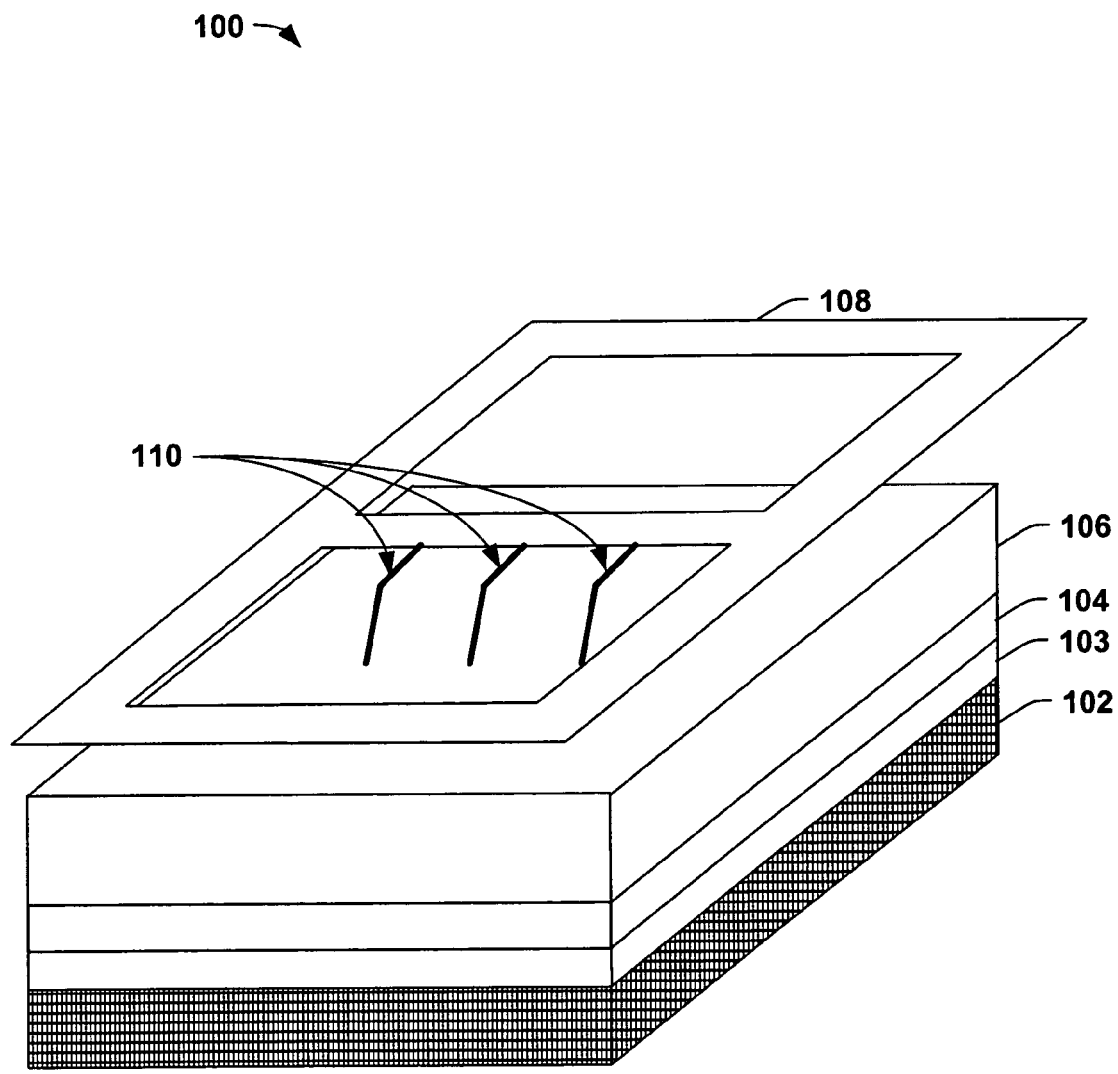
FIG. 1 is a 3-D diagram of a metal sulfide based memory device in accordance with an aspect of the present invention.

Referring initially to FIG. 1, a 3-D diagram of a metal sulfide based memory device 100 is depicted in accordance with an aspect of the present invention. Memory device 100 is composed of a substrate 102, control circuitry layer 103, a backplane 104, a planar medium 106, sled 108, and probes 110. The planar medium 106 is a storage medium made of a metal sulfide based material for housing a plurality of memory cells. Backplane 104 lies on top of the control circuitry layer 103, which is formed on substrate 102, and below the planar medium 106. The backplane 104 contains, inter alia, circuitry for enabling communication and interaction with a multitude of electronic components (e.g., a central processing unit (CPU)). In addition, FIG. 1 illustrates a plurality of probes 110 connected to a sled 108. In response to a control signal from the control circuitry residing in control circuitry layer 103, the sled 108 actuates probes 110 across the planar medium 106 facilitating reading, writing, and erasing memory cells.

The planar medium 106 is comprised of a metal sulfide based material, such as a silver or copper sulfide based molecule and a conjugated polymer. The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials contributes to the controllably conductive properties of the selectively conductive planar medium 106.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with a conductivity-facilitating compound.

The organic material may be cyclic or acyclic. For some cases, such as organic polymers, the organic material self assembles during formation or deposition. Examples of conjugated organic polymers include one or more of polyacetylene (cis or trans); polyphenylacetylene (cis or trans); polydiphenylacetylene; polyaniline; poly (p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt).

The organic medium 106 can be formed via a number of suitable techniques. One suitable technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). Furthermore, it should be noted and appreciated that the organic layer or organic medium may be replaced by an in-organic material, usually of a porous nature. Silicon dioxide formed with a porous structure is an example of a suitable material.

Figure 2:
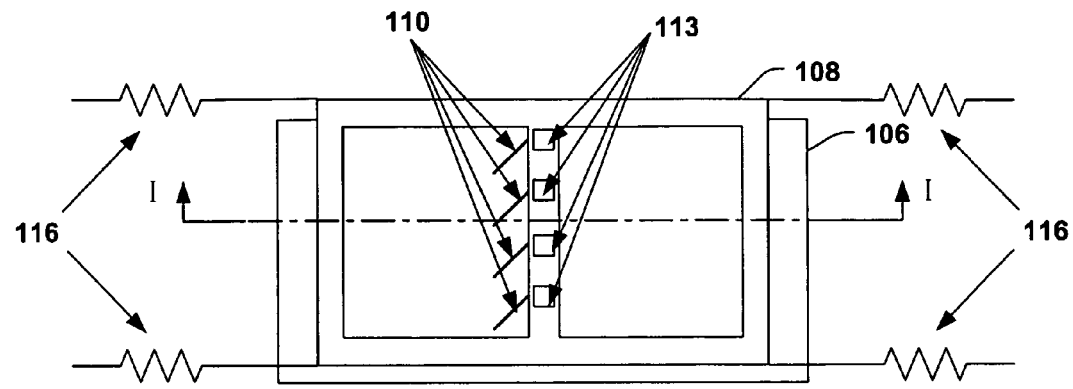
FIG. 2 is a top view of an MEMS actuator interacting with a metal sulfide based memory device in accordance with an aspect of the present invention.
Figure 3:
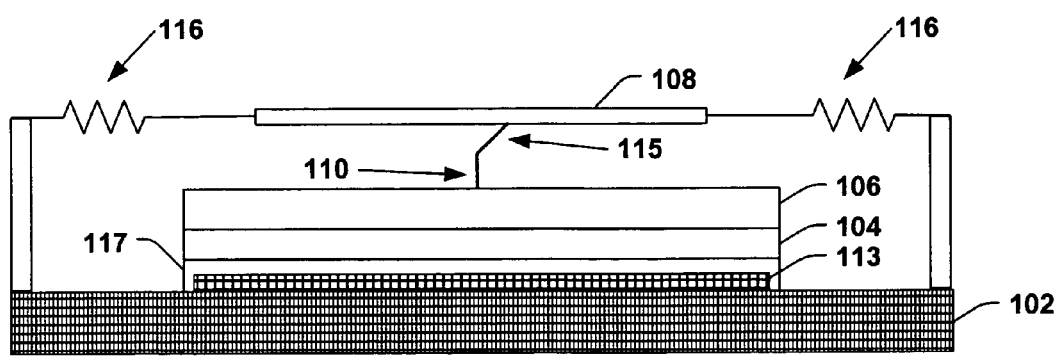
FIG. 3 is a schematic cross section view illustration of the MEMS actuator interacting with a metal sulfide based memory device along the lines I-I in accordance with an aspect of the present invention.

Referring to FIGS. 2 and 3, a micro/nano-actuator is depicted in accordance with an aspect of the present invention. FIG. 2 illustrates a birds eye view of the actuator, while FIG. 3 illustrates a cross sectional view along the lines I-I. Referring first to FIG. 2, the MEMS actuator is comprised of a sled 108, controllers 113, probes 110, and actuating elements 116. All parts of the actuator may be fashioned using conventional micromachining techniques.

Micromachining is a process that enables formation microscopic mechanical parts from a silicon substrate and/or other materials. The process normally starts with a substrate containing at least one metal layer forming the microelectromechanical device of interest, and at least one oxide layer. The material is then subjected to anisotropic etching to form holes, trenches, and other structural features in the metal layer. Subsequently, the substrate and oxide layers are removed. Furthermore, many types of materials may be used in MEMS micromachining including metal, metal alloys, ceramics and polymers.

The sled 108 can be formed of silicon using conventional techniques and will ultimately reside above and substantially parallel to the memory media. Microscopic actuating elements 116 may be fashioned with and connected to the media sled 108 to provide mechanical movement of the sled 108 and probes 110 relative to the metal sulfide based medium 106. Actuating elements 116 could be thermal actuators such as heating filaments that thermally expand and contract based on the total heat applied to them by heaters (not shown). However, other types of actuation are contemplated by this invention, including electrocstrictive, magnetostrictive, electrorheological, piezoelectric, and chemical actuation. Furthermore, while in the one embodiment actuators may move the sled in one direction (e.g., X) the present invention also contemplates employing multiple additional actuators to provide mechanical movement in more than one direction (e.g., X, Y, and Z). However, no matter what type of actuation or how many actuators are employed the micro-actuated movement of the sled should enable sub-micron level resolution. Still further yet, it should be appreciated that the scope of this invention is not limited to probe actuation. Alternatively, the media 106 may be suspended below and actuated relative to stationary probes.

Additionally, the micromachined actuator can be integrated with microelectronics. For example, in one embodiment controllers 113 may be fabricated on the same chip with the MEMS actuator and/or memory media. Controllers 113 may contain a microcontroller, a signal processor, and or other application specific integrated circuits (ASICs). Furthermore, each controller 113 can be formed using conventional micromachining techniques and may be incorporated into the memory device via a solder bumping process, for example. The controllers 113 are capable of implementing the functionality of the memory device (e.g., formatting, reading, writing, and/or erasing data). In addition, by assigning each probe its own control circuitry, individual probe addressability is enabled. Additionally or alternatively, integrated microelectronics could be formed below the memory medium prior to fabrication of the micromechanical structures (FIG. 1 and FIG. 3). Microelectronic circuitry such as a CMOS logic circuits and/or CMOS control circuits may be formed, for example, on the back layer of the substrate 102. Thereafter, a protective coating 117 can be applied over the CMOS circuitry and subsequently the backplane 104 and memory media layer 106 could be formed over the CMOS layer. The described layering technique thus enables the whole memory device to be fabricated on a single die.

Turning to FIG. 3, a schematic cross-sectional view of FIG. 2 along I-I is depicted. As shown, probes 110 are attached to microcantilevers or beams 115 which are part of the center of sled 108. Each probe 110 is consistently shaped with a very sharp tip to enable nano-scale surface inspection. The probes can be made from a variety of conductive materials including tungsten, iridium, platinum, or gold. However, when the tips are designed to contact the media surface, it is preferred that the tips be formed of graphite, because graphite has suitable conductive properties and is self lubricating. As shown, the probes are securely suspended from the actuator via a microcantilever or beam 115. It should be understood that the microcantilever, could be made of many different materials. For instance, the cantilever could be made of a piezoelectric material, such that movement in the Z direction (i.e., perpendicular to the media surface) is brought about when an electrical current is applied. Moreover, each probe is of atomic scale and is designed to facilitate interaction with the metal sulfide based media. The atomic size of the probes enables them to read at very high densities (e.g., 200 GB/in$^2$). Additionally, although each single probe may only be able access data at a rate, for example of 100-200 Kbit/second, bits may be accessed in parallel to achieve a higher aggregate bandwidth. For instance, if a single byte of information was to be read with exactly eight probes, then concurrently the first probe tip would read the first bit, the second probe tip would read the second bit, etc.

In addition to the atomic structure of the probe, selection of probe mode is an important consideration. In one embodiment, memory cells may be analyzed (e.g., read, written, programmed, erased) via probes that contact the surface of the metal sulfide based memory medium. Contacting probes, in addition to their relative simplicity, enable a significant current flow from the probe tip to the memory media. Thus, contacting mode is especially attractive for applying a relatively high positive or negative voltage such as during programming or erasing of a memory cell, which is described in further detail infra. Additionally, if the probes are operating in contact mode it is not necessary that the tips maintain continuous contact with the surface during actuation. The probes may be removed from the surface during actuation using microcantilever 115. There is thus a trade off between dealing with issues of durability due to the friction resulting from the continuous contact, and adding an additional step to the actuation process (i.e., actuate versus raise probes from surface then actuate).

Assuming the metal sulfide based media layer is of sufficient conductivity to enable a tunnel current, memory cells may also be scrutinized (e.g., read, written, programmed, erased) by employing a non-contacting scanning probe microscopy. Specifically, each probe 110 could operate as a scanning tunneling microscope (STM). STMs can operate in either constant height or constant current mode. The STM of the present invention should, however, be operated in constant height mode since the memory cells are programmed and read using variations in current. Additionally, constant height mode is faster than constant current mode, because in constant current mode the height of the probe must be adjusted continuously to ensure that the current is indeed constant.

Figure 4:
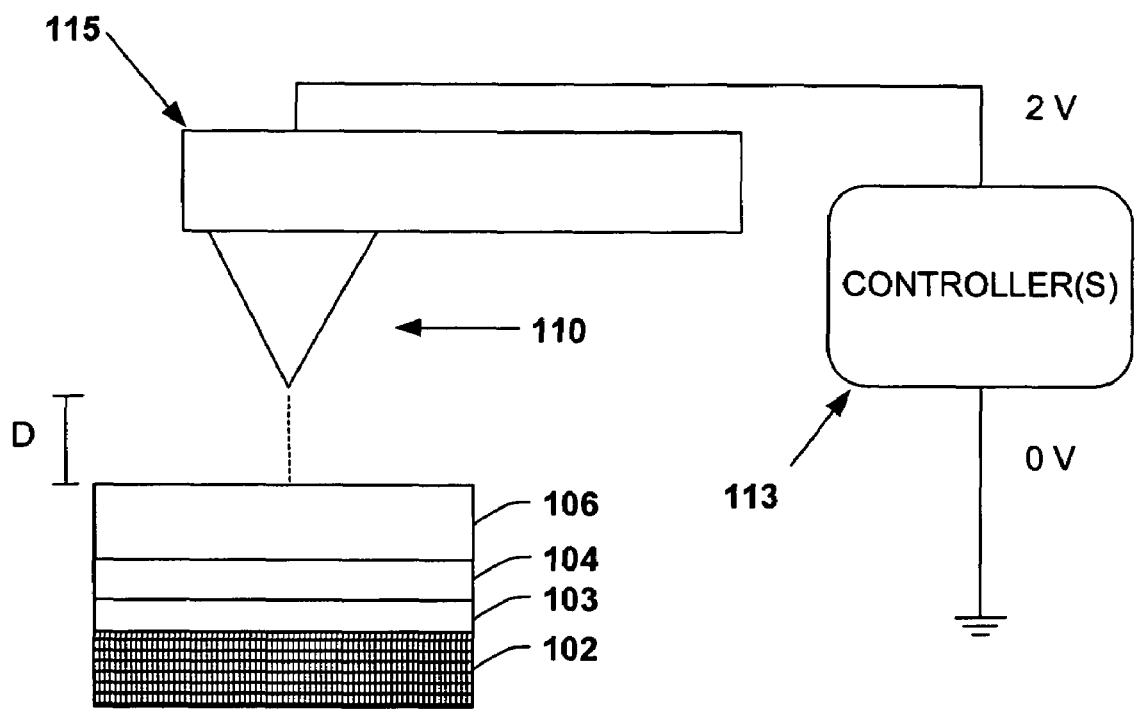
FIG. 4 is a schematic illustration of the interaction between a probe, a controller and a memory cell in accordance with an aspect of the present invention.

Referring to FIG. 4, a probe 110 attached to microcantilever 115 in connection with controller(s) 113 is illustrated in tunnel mode over the memory device comprised of substrate 102, control circuitry layer 103, backplane 104, and metal sulfide based planar medium 106. In tunnel mode, it is important to ensure that a constant distance "D" is maintained between the probe tip and the metal sulfide based medium 106 from memory location to memory location. When a probe tip with a bias voltage is brought in very close proximity to the surface of the planar medium 106 (e.g., 10 Å) electrons begin to tunnel through the gap between the probe tip and the medium 106, as illustrated by a dashed line in FIG. 4. However, the resulting value of the current is dependant on the tip to medium spacing "D." Therefore, for accurate results the probe tip 110 to metal sulfide based medium surface gap, "D", must remain consistent from memory location to memory location. A micro-sensor and feedback loop may be employed to maintain a constant probe to surface distance. As the probes hover over the memory cells, a micro-sensor, attached to the probe 110 or cantilever 115, for example, may detect the probe tip to surface distance. Additional micro-actuators can then be employed to adjust the cantilevers 115 up and down to ensure that a constant distance "D" is maintained.

Figure 5:
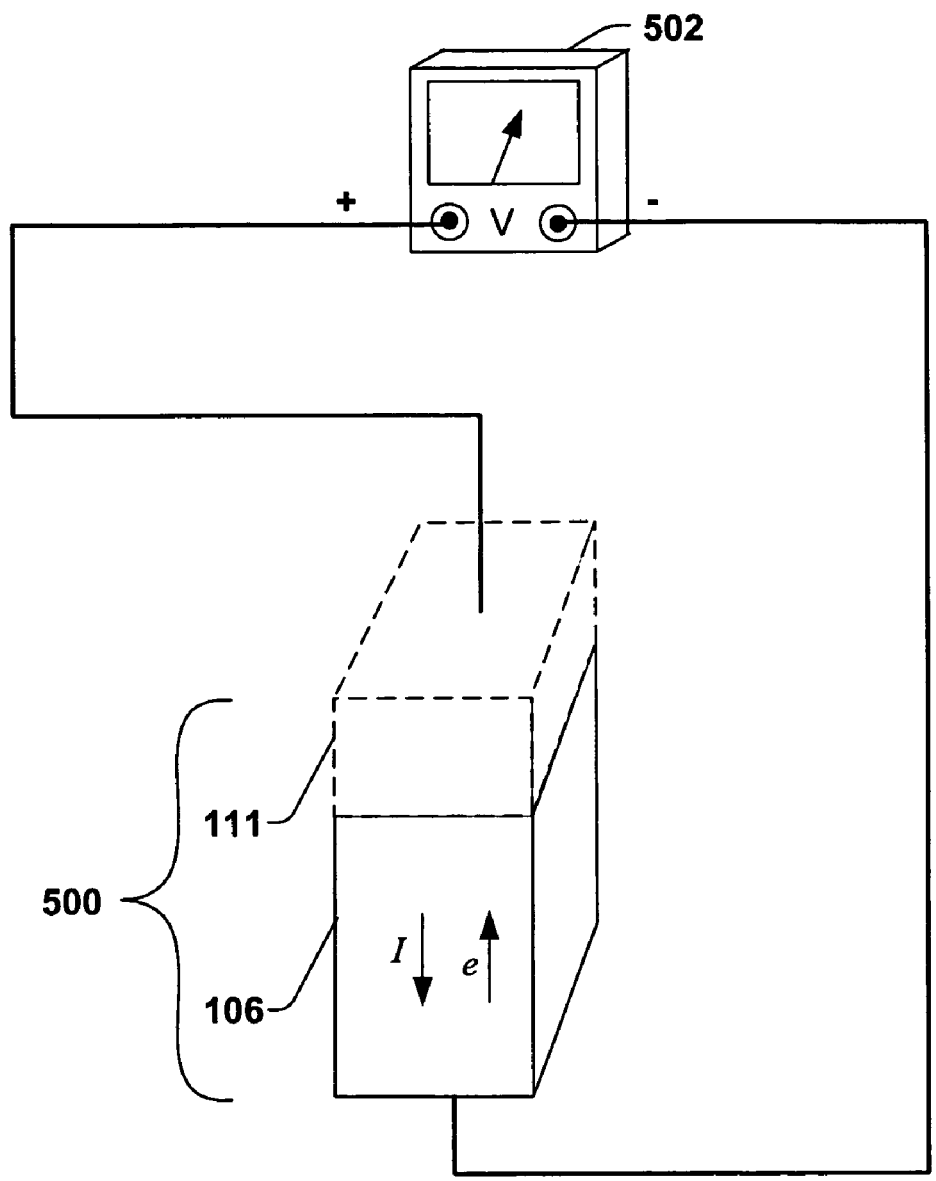
FIG. 5 is a 3-D diagram of a single metal sulfide based memory unit in accordance with an aspect of the present invention.

FIG. 5 depicts a 3-D diagram of a single metal sulfide based memory cell location in accordance with an aspect of the present invention. The diagram illustrates a voltage source 502 connected to the memory cell 500 composed of organic polymer layer 106 and a metal sulfide based active layer 111 for programming the memory. The active layer sits below the organic memory medium 106. Specifically, the active layer facilitates conductive properties of the media 106 (e.g., conductive, non-conductive, semi-conductive) such that they can be modified in a controlled manner by applying various voltages (e.g. bias voltages) across the memory cell.

The active layer 111 contains at least one conductivity-facilitating compound that contributes to the controllably conductive properties of the selectively conductive media 107. The conductivity-facilitating compound has the ability to donate and accept charges (holes and/or electrons). Generally, the conductivity-facilitating compound has at least two relatively stable oxidation-reduction states. The two relatively stable states permit the conductivity-facilitating compound to donate and accept charges and electrically interact with the organic layer 106. The particular conductivity-facilitating compound employed is selected so that the two relatively stable states match with the two relatively stable states of the conjugated organic molecule of the layer 106

Examples of conductivity facilitating compounds that may make up the active layer 111 include one or more of copper sulfide ($Cu_2S$, $CuS$), copper oxide ($CuO$, $Cu_2O$), manganese oxide ($MnO_2$), titanium dioxide ($TiO_2$), indium oxide ($I_3O_4$), silver sulfide ($Ag_2S$, $AgS$), iron oxide ($Fe_3O_4$), and the like.

The active layer 111 has a suitable thickness that can vary based on the implementation and/or memory device being fabricated. Some examples of suitable thicknesses for the active layer 111 are as follows: a thickness of about 2 Å or more and about 0.1 µm or less, a thickness of about 10 Å or more and about 0.01 µm or less, and a thickness of about 50 Å or more and about 0.005 µm or less.

In order to facilitate operation of the metal sulfide based memory device, the organic layer 106 is generally thicker than the passive layer 111. In one aspect, the thickness of the organic layer is from about 0.1 to about 500 times greater than the thickness of the passive layer. It is appreciated that other suitable ratios can be employed in accordance with the present invention.

The active layer (e.g., CuS) employed in metal sulfide based memory devices play an important role. Presence of an active layer may significantly improve the conductivity of the organic layer 106. This characteristic is at least partially a function of the following: charge carrier generated by the active layer, build up of a charge depletion layer, charge carrier distribution in organic material, and memory loss due to charge carrier redistribution after reversing electric field.

The metal sulfide based memory cell 500, like conventional memory devices, can have two states, a conductive (low impedance or "on") state or non-conductive (high impedance or "off") state. However, unlike conventional memory devices, the metal sulfide based memory cell 500 is able to have/maintain a plurality of states, in contrast to a conventional memory device that is limited to two states (e.g., off or on). The metal sulfide based memory cell 500 can employ varying degrees of conductivity to identify additional states. For example, the metal sulfide based memory cell 500 can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single metal sulfide based memory cell 107, such as 2 or more bits of information or 4 or more bits of information (e.g., 4 states providing 2 bits of information, 8 states providing 3 bits of information . . . ).

Switching the metal sulfide based memory unit to a particular state is referred to as programming or writing. Programming is accomplished by applying a particular voltage pulse (e.g., 9 volts, 2 volts, 1 volts, . . . ) across the selectively conductive media 500 via the probes 110. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the metal sulfide based memory device, the thickness of the various layers, and the like. The voltage supply 502 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the metal sulfide based memory cell 500; whereas the absence of the external stimuli that exceeds a threshold value ("off" state) prevents an applied voltage to write or erase information into/from the metal sulfide based memory cell 500.

To read information from the metal sulfide based memory device, a voltage or electric field (e.g., 2 volts, 1 volts, 0.5 volts) is applied via the voltage source 502. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the metal sulfide based memory cell 500, a negative voltage or a polarity opposite the polarity of the writing signal that exceeds a threshold value is applied.

Prior to utilization of the metal sulfide based memory device, formatting information should be written to the metal sulfide based planar layer. This formatting information should include information points such that a multitude of memory locations lie between the information points. For example, a number of tracks and sectors could be defined via information points on the medium. Formatting the metal sulfide based planar layer is significant at least because it facilitates essential device operations such as the movement of probes across the surface of a metal sulfide based medium. Thus, formatting information can have a significant effect on the overall areal density of the device as it relates to the accuracy of probe positioning.

The planar medium 106 may be formatted using any number of formatting techniques. For example, servo information could be written to the medium during a fabrication process thereby encoding digital track and sector information in the medium, similar to a method used to format hard disk drives. Alternatively, formatting of the medium could be accomplished post fabrication via the probes and actuator in a manner similar to the technique used to format optical disks (e.g., CD-R and CD-RW) or floppy disks.

Figure 6A:
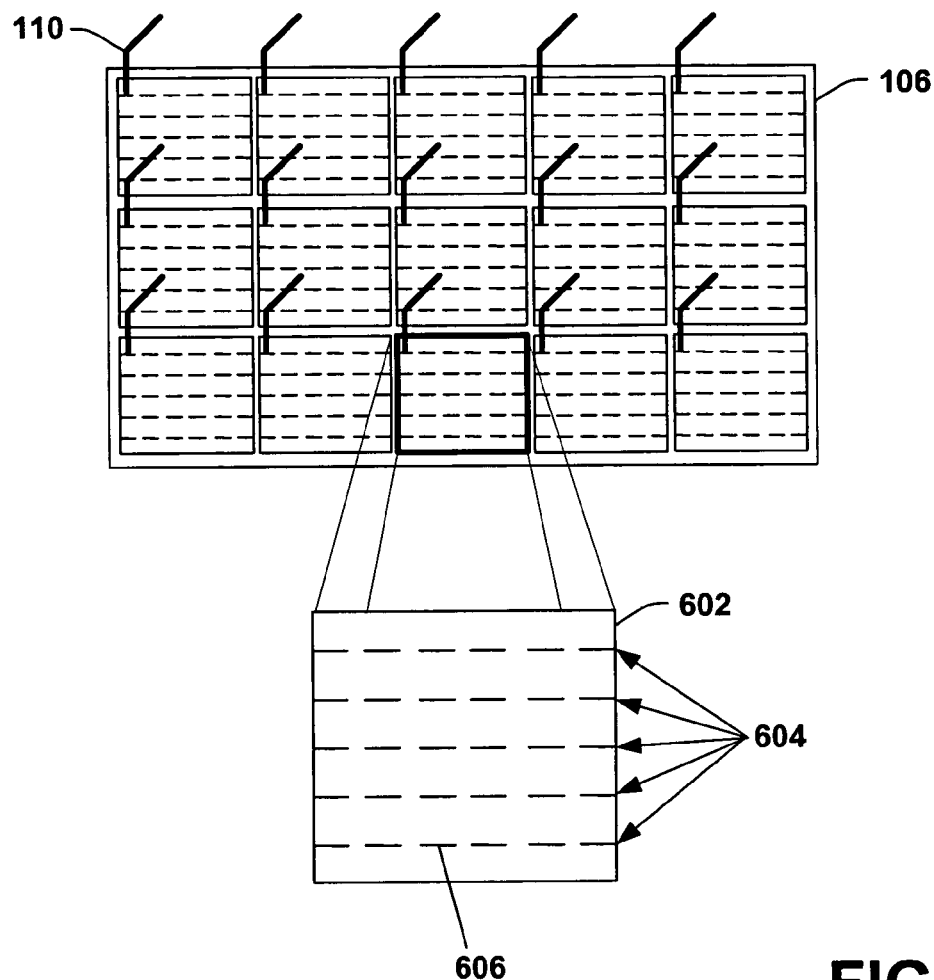
FIG. 6a is a schematic illustration of an exemplary format for the metal sulfide based polymer medium in accordance with an aspect of the present invention.

Turning to FIG. 6a, an exemplary format for a planar memory medium is depicted according to an aspect of the present invention. As is shown, the planar medium 106 is divided up into several square sections beneath a plurality of individual probes. Each square along the planar memory media 106 represents the sweep area 602 for each of a multitude of probes. In other words, the sweep area 602 delineates the boundaries of each individual probe's actuation. Within the sweep area 602, lies a plurality of tracks 604 which are further divided into sectors 606.

Figure 6B:
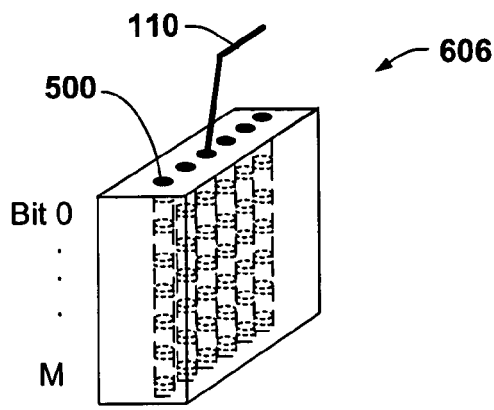
FIG. 6b is a 3-D diagram of a subsection of FIG. 6a in accordance with an aspect of the present invention.

FIG. 6b depicts a single sector 606 of a track of memory. As illustrated, each sector 606 is composed of a number of memory cells 500, where each memory cell 500 includes a multitude of bits. It should be understood that the bits are shown as dashed cylinders for ease of comprehension only. The memory cell 500 actually employs varying degrees of conductivity to identify various states which thereby enables the storage of multiple bits of information in a single metal sulfide based memory cell 500, such as 2 or more bits of information or 4 or more bits of information (See discussion supra.).

In any event, when reading data from the device, the probe tips need to be closely aligned with the tracks for memory location sought to be accessed. To allow for efficient use of memory space, tracks should be exceedingly narrow, ideally limited only by the width of the probe tips, and spaced relatively close together. Appropriate care should be taken to ensure the alignment of probe tips and tracks, because improper alignment could cause inaccurate data reads, which could also damage existing stored data or otherwise cause data to become irretrievable.

Figure 7:
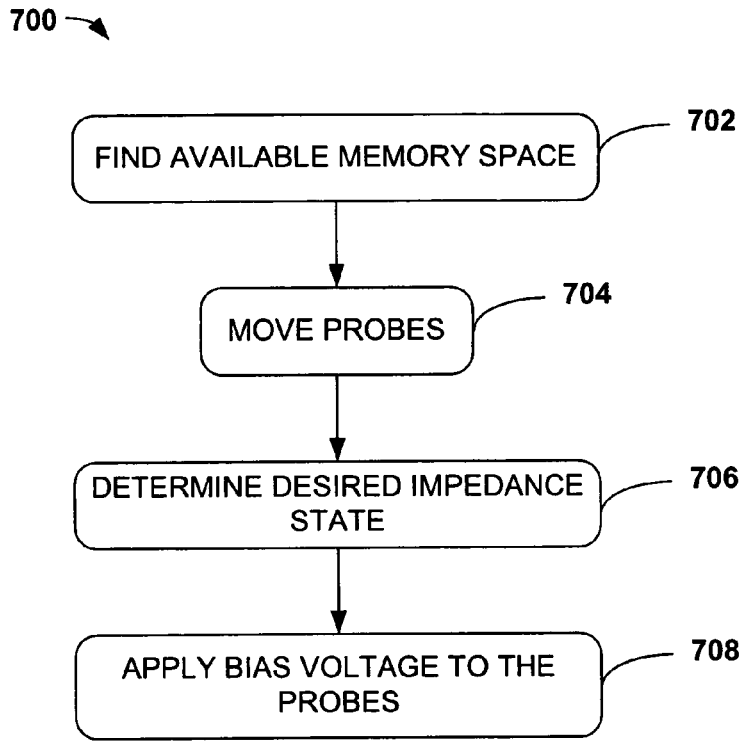
FIG. 7 is a flow diagram depicting a method of writing memory cells in accordance with an aspect of the present invention.
Figure 8:
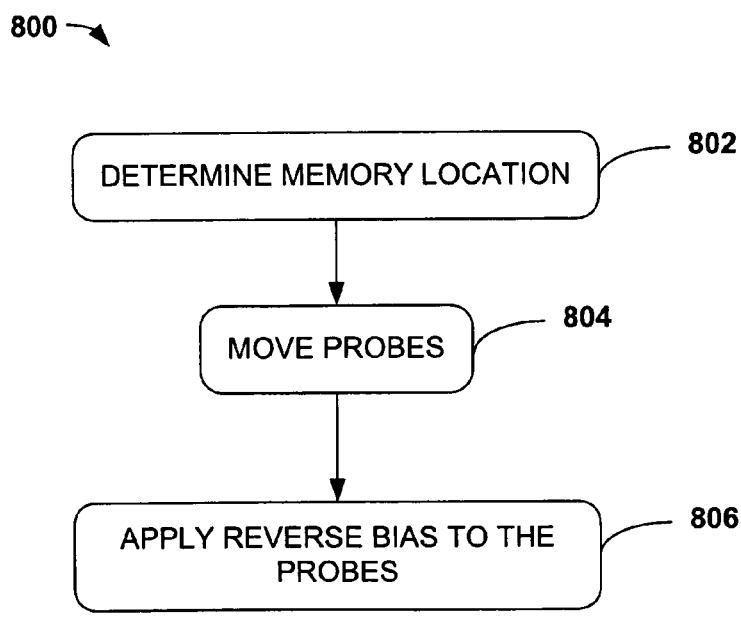
FIG. 8 is a flow diagram depicting a method of erasing memory cells in accordance with an aspect of the present invention.
Figure 9:
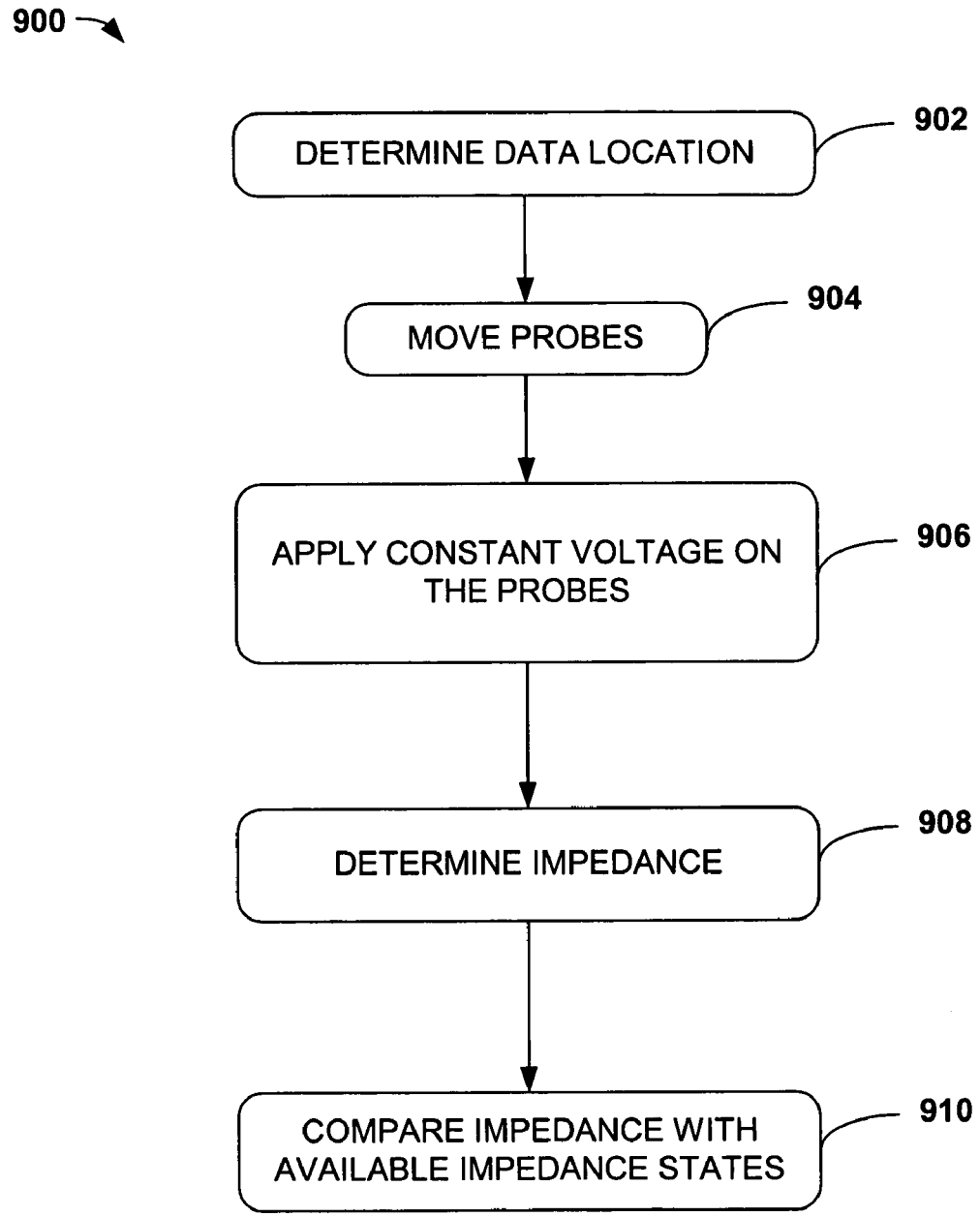
FIG. 9 is a flow diagram depicting a method of reading memory cells in accordance with an aspect of the present invention.

In view of the exemplary system(s) described supra, a methodology that may be implemented in accordance with the present invention will be better appreciated with reference to the flow charts of FIGS. 7-9. While for purposes of simplicity of explanation, the methodology is shown and described as a series of blocks, it is to be understood and appreciated that the present invention is not limited by the order of the blocks, as some blocks may, in accordance with the present invention, occur in different orders and/or concurrently with other blocks from what is depicted and described herein. Moreover, not all illustrated blocks may be required to implement the methodology in accordance with the present invention.

Referring to FIG. 7, a flow diagram of a method 700 of writing information to the memory device is illustrated in accordance with the present invention. As previously discussed, programming a memory cell corresponds to changing the impedance of the metal sulfide based cell material. To program or write a cell in an array of cells, the controller(s) must first determine the location of available memory space at 702. At 704 the controller then applies the appropriate signals to the actuators to move the sled to a position such that the probes are centered over cells to be programmed. Next, at 706, a desired impedance state is determined such that multiple bits can be programmed into a single cell. After determining the desired impedance, the appropriate voltage bias voltage is applied memory cell via the probes at 706.

FIG. 8 is a flow diagram of a method 800 of erasing information stored in a memory device in accordance with the present invention. At 802, the controller first determines the location of the cell or cells that are to be erased. At 804, the controller then provides appropriate signals to the actuators to move the probes over the cell or cells to be deleted. Finally, at 806, a reverse bias voltage is applied to the memory cell. For example, if a memory cell was capable of storing only one bit of information by applying 2 volts, then that same memory cell could be erases by applying −2 volts. Where the cell contains multiple bits of information, a predetermined voltage (e.g., −2 volts) may be applied to erase all bits of information or the cell. Alternatively, the cell could first be read, then totally erased by applying a predetermined voltage (e.g., −2V) followed by reprogramming the cell by applying a voltage corresponding the impedance value the cell should now have without the bits that were to be erased. However, the shorter method would simply be to compute and apply a bias voltage that sets the cell to the correct value. For example, if the cell is capable of storing two bits, the cell would have four possible impedance states corresponding to "00," "01," "10," and "11." Assuming the memory cell currently has an impedance (e.g., high) corresponding to "11" and the most significant bit is to be erased, then a suitable voltage can be applied to lower the impedance to a level (e.g., low) corresponding to "01."

Turning to FIG. 9, a method 900 of reading information stored in the memory device of the present application is depicted. At 902, the location of the data to be read is determined. At 904, the probes are moved over the cells to be read. At 906, a constant voltage (e.g. 1 volt) is applied to the probes residing above the cell or cells to be read thereby affecting a constant potential difference across the memory cell or cells to be read. The impedance is then determined at 908. To determine the impedance, the current in the probe at the fixed voltage is sensed and the impedance is then calculated using Ohm's Law. After the impedance is determined, it is compared at 910 with available impedance states to determine the logical state of the cell.

As discussed supra, the desired information content is typically stored in the metal sulfide based memory device at addressable memory locations (e.g., cells) in a specified number of bits. However, unlike conventional memory devices, more than one bit of information can be read from a single memory cell.

It is to be appreciated that the above descriptions of the methods 700-900 have been somewhat simplified in order to facilitate understanding of the present invention. For example, cells of the memory device are accessible via an addressing scheme in order to read and write memory locations. Additionally, the memory cell(s) can be erased (e.g., set to a default state) by applying an appropriate voltage across the selectively conductive media of the memory device. The default state is generally a very highly conductive or very low conductive impedance state.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present invention. Therefore, it is manifestly intended that this invention be limited only by the following claims and equivalents thereof. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A memory device comprising:
a backplane lying upon a substrate;
a metal sulfide based memory media overlying the backplane, comprising of an array of selectively conductive memory cells, wherein the memory cells are defined by positioning a plurality of probes over the metal sulfide based media; and
a microactuator assembly operative to move the plurality of probes over the memory cells to facilitate reading, writing, and erasing of selected cells, wherein the reading, writing, and erasing of the memory cell is performed by applying a bias voltage across the memory cell, which causes the memory cell to take on a desired impedance state, the impedance state representing the memory cell.

2. The memory device of claim 1, further comprising MEMS control circuitry fabricated on the substrate.

3. The memory device of claim 1, wherein the probes are graphite.

4. The memory device of claim 1, wherein the media is used in conjunction with a polymer.

5. The memory device of claim 4, wherein the polymer is selected from one of the group consisting of polyacetylene, polyparaphenylene, polythiophene, polypryrrole, and polyaniline, polyphenylacetylene, polydiphenylacetylene.

6. The memory device of claim 1, wherein the probes are scanning tunneling microscopic probes.

7. The memory device of claim 6, wherein the probes are operated at a constant distance away from the memory cell.

8. The memory device of claim 7, wherein the distance between the probe and the memory cell is maintained constant by employing a feedback loop and a microactuated cantilever.

9. The memory device of claim 1, wherein the probes are in contact the surface of the memory media.

10. A memory device comprising:
a metal sulfide based memory media comprising of a plurality of metal sulfide based memory cells, wherein the memory cells are defined by positioning a array of probes over the metal sulfide based media;
wherein the array of probes operative to read, write, and erase the memory media, the reading, writing, and erasing of the memory media is performed by applying a bias voltage across the memory cell, which causes the memory cell to take on a desired impedance state, representing the memory cell; and
controllers for each probe used for formatting the memory media and guiding the motion of the probes.

11. The memory device of claim 10, wherein each memory cell has a plurality of conductivity states at each distinguishable memory cell site.

12. The memory device of claim 11, wherein each distinguishable memory cell site is determined by size and motion of the probes.

13. A memory device comprising:
a substrate;
a planar medium comprising of a metal sulfide based material and a conjugated polymer layer, the planar medium housing a plurality of memory cells, wherein the memory cells are defined by positioning of a plurality of probes over the metal sulfide based material;
a backplane lying between the polymer layer and the substrate;
at least one probe facilitating testing the state of the polymer layer; and a MEMS actuator operative to move the at least one probe over the polymer layer.

14. A method for retrieving cell state values, comprising:
- positioning microelectromechanical system (MEMS) probes over selected metal sulfide media to define an array of memory cells;
- applying a fixed voltage across a subset of the cells;
- determining the impedance of the subset of cells; and
- programming the metal sulfide memory cells based on the impedance levels.

15. The method of claim 14, wherein the cell impedance is determined by analyzing tunnel current between the probe and the memory cell.

16. The method of claim 14, further comprising comparing the measured impedance value with available impedance states to determine the logical state of multiple bits of information contained within the cell.

17. A method for programming cell state values, comprising:
- positioning microactuated probes over selected metal sulfide media to define an array of memory cells;
- determining a desired impedance state of the memory cells;
- applying a threshold voltage across the memory cells corresponding to the desired impedance state; and
- programming the metal sulfide memory cells based on the impedance states.

18. A method of erasing memory cell state values comprising:
- positioning probes over selected metal sulfide based memory cells;
- measuring the impedance state of the selected memory cells;
- determining an impedance state of the memory cells with selected bits erased; and
- applying a threshold voltage to the memory cells such that the resulting cell impedance corresponds to the impedance state of the cell with the selective bits erased.

19. A memory device comprising:
- a metal sulfide based memory media;
- means for positioning microactuated probes over selected metal sulfide based memory media to create an array of memory cells;
- means for applying bias voltage across the memory cells;
- means for determining impedance states of the memory cells;
- means for at least one of reading, writing, and erasing the memory media comprising of an array of memory cells; and
- means for formatting the memory media.

* * * * *